(12) United States Patent
Divakaruni et al.

(10) Patent No.: US 6,504,210 B1
(45) Date of Patent: Jan. 7, 2003

(54) FULLY ENCAPSULATED DAMASCENE GATES FOR GIGABIT DRAMS

(75) Inventors: Ramachandra Divakaruni, Somers, NY (US); Jeffrey Peter Gambino, Westford, VT (US); Jack A. Mandelman, Stormville, NY (US); Viraj Sardesai, Poughkeepsie, NY (US); Mary Elizabeth Weybright, Pleasant Valley, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/599,484

(22) Filed: Jun. 23, 2000

(51) Int. Cl.$^7$ ................. H01L 29/76; H01L 21/8238
(52) U.S. Cl. ................. 257/344; 257/408; 438/230; 438/284; 438/592; 438/596
(58) Field of Search ................. 257/408, 346, 257/330, 344, 632, 751, 763; 438/284, 230, 588, 592, 561, 595, 596, 195, 197

(56) References Cited

U.S. PATENT DOCUMENTS

| | | |
|---|---|---|
| 4,755,478 A | 7/1988 | Abernathey et al. |
| 5,120,668 A | 6/1992 | Hsu et al. |
| 5,573,961 A | 11/1996 | Hsu et al. |
| 5,804,852 A | 9/1998 | Yang et al. |
| 5,831,334 A | 11/1998 | Prall et al. |
| 5,856,690 A | 1/1999 | Burns et al. |
| 5,897,349 A | 4/1999 | Agnello |
| 5,946,570 A | 8/1999 | Kasai et al. |
| 5,950,090 A | 9/1999 | Chen et al. |
| 5,960,270 A * | 9/1999 | Misra et al. ................. 438/197 |
| 5,966,597 A | 10/1999 | Wright |
| 5,973,343 A | 10/1999 | Takaishi |
| 5,981,320 A | 11/1999 | Lee |
| 6,087,231 A * | 7/2000 | Xiang et al. ................. 438/287 |
| 6,087,248 A * | 7/2000 | Rodder ................. 438/561 |
| 6,159,835 A * | 12/2000 | Visokay et al. ................. 438/592 |
| 6,277,719 B1 * | 8/2001 | Chern et al. ................. 438/585 |

* cited by examiner

Primary Examiner—Steven Loke
Assistant Examiner—Donghee Kang
(74) Attorney, Agent, or Firm—Ira D. Blecker

(57) ABSTRACT

A fully polysilicon encapsulated metal-containing damascene gate structure is provided that is useful in Gigabit DRAM (dynamic random access memory) device. The fully encapsulated metal-containing damascene gate comprises a semiconductor substrate having a gate oxide layer formed on a surface portion of said substrate; a gate polysilicon layer formed on said gate oxide layer; a metal layer formed on said polysilicon layer; and a cap oxide layer formed on said metal layer, wherein said metal layer is completely encapsulated by said polysilicon and oxide layers. The damascene gate structure may also include polysilicon spacers formed on said gate polysilicon layer and said metal layer is encapsulated therein and outer polysilicon sidewalls that are oxidized.

8 Claims, 4 Drawing Sheets

FULLY ENCAPSULATED DAMASCENE GATES FOR GIGABIT DRAMS

FIELD OF THE INVENTION

The present invention relates to semiconductor devices, and more particularly to a fully encapsulated metal-containing damascene gate that is useful as a field effect transistor (FET) in Gigabit dynamic random access memory (DRAM) devices. The present invention also relates to methods of manufacturing the fully encapsulated metal-containing damascene gate which allow the use of a high temperature sidewall gate oxidation step.

BACKGROUND OF THE INVENTION

The present processing of DRAM structures and other like memory structures employs a polysilicon/metallic silicide, such as polysilicon/WSiX, stack as the gate conductor. Gate conductors having a polysilicon/metallic silicide stack typically have a minimum sheet resistivity of about 10 ohms/square or more. Although the resistivity of a polysilicon/metallic silicide stack is suitable for some memory device applications, Gigabit DRAM applications require a much lower resistivity of the gate structure. This requirement has prompted a recent move to gate structures in which the metal silicide is replaced by an elemental metal.

A major problem of using metal-containing gates in Gigabit DRAM applications is that low temperature processing, typically less than 900° C., is required to prevent diffusion of the elemental metal into the surrounding material layers of the gate structure. Working against this is the fact that a good bird's beak oxidation at temperatures higher than 900° C. is needed at the gate edges to provide a low leakage DRAM transfer array device. The above temperature requirements drive a very small process window for gate stacks containing a metal gate.

In prior art DRAM processes, it is also well known that gate polysilicon reactive-ion etching (RIE) damage adversely affects DRAM retention and that support performance is a strong function of the gate stack of the DRAM array (since high temperature post gate stack processing steps adversely affect the support device).

In view of the drawbacks mentioned hereinabove with prior art DRAM processes, there is a continued need for developing a new and improved process in which metals can be used in place of metallic silicides in a gate structure without exhibiting any of the aforementioned problems.

SUMMARY OF THE INVENTION

One object of the present invention is to provide a method of manufacturing a low resistivity damascene gate for use in high density Gigabit DRAM architectures.

Another object of the present invention is to provide a damascene metal gate that has a high retention associated therewith.

A further object of the present invention is to provide a damascene metal gate that has a low leakage associated therewith.

A still further object of the present invention is to provide a self-aligned damascene metal gate for sub $8F^2$ vertical transfer devices.

A yet further object of the present invention is to provide a damascene metal gate having a low aspect ratio which allows for low temperature post gate stack processing and a high performance DRAM support device.

These and other objects and advantages are achieved in the present invention by providing methods wherein a damascene gate is formed such that the metal conductor of the damascene gate is encapsulated by polysilicon and oxide. The inventive methods allow for high temperature gate sidewall oxidation for a good bird's beak at the gate edges, while maintaining a low aspect ratio for low temperature post gate stack processing to ensure a high performance DRAM support device.

Specifically, in one embodiment of the present invention, the inventive method comprises the following processing steps:

(a) providing a semiconductor structure comprising at least one gate hole formed in a gate stack, said gate stack including at least a pad oxide layer and a pad nitride layer being formed on a surface of a substrate, said gate hole having a sacrificial oxide layer located on a bottom portion thereof and sacrificial spacers located on said sacrificial oxide layer;

(b) forming a threshold voltage control region in said substrate;

(c) removing said sacrificial spacers and said sacrificial oxide layer from said gate hole so as to expose a portion of said substrate;

(d) forming a gate oxide layer on said exposed portion of said substrate;

(e) forming a recessed gate polysilicon layer in said gate hole on said gate oxide layer;

(f) forming polysilicon spacers on said recessed gate polysilicon layer;

(g) forming a barrier layer in said gate hole and on said pad nitride layer;

(h) forming a recessed metal layer in said gate hole on said barrier layer;

(i) forming a cap oxide layer in said gate hole on said recessed metal layer; and (j) removing said barrier layer and said pad nitride layer surrounding said gate hole so as to form a gate structure in which said recessed metal layer is completely encapsulated by polysilicon and oxide.

In an optional, but preferred embodiment of the present invention, the exposed polysilicon sidewalls of said gate structure provided in step (j) above are subjected to an oxidation step.

In another embodiment of the present invention, the gate polysilicon layer formed in step (e) is not recessed. In that embodiment of the present invention, the gate polysilicon layer is formed on the pad nitride layer surrounding said gate hole as well as in the gate hole, and during step (j) above, the polysilicon layer surrounding the gate hole is removed. Alternatively, in this embodiment of the present invention, the polysilicon layer and barrier layer may be recessed below the pad nitride layer prior to forming the recessed metal layer. Additionally, when a non-recessed gate polysilicon layer is employed, oxide spacers are optionally present in the structure.

It is noted that after conducting the various processing steps of the present invention including the optional oxidation step, conventional post gate stack processing steps can be employed so as to form a structure in which the inventive damascene gate is present therein.

The above methods provide a damascene gate structure in which the metal layer is completely encapsulated by polysilicon and oxide. Specifically, in one embodiment of the present invention, the damascene gate structure of the present invention comprises:

a substrate having a gate oxide layer formed on a surface portion of said substrate;

a gate polysilicon layer formed on said gate oxide layer;

a metal layer formed on said gate polysilicon layer;

a cap oxide layer formed on said metal layer, wherein said metal layer is completely encapsulated by said polysilicon and oxide layers.

In one embodiment of the present invention, the inventive damascene gate structure includes outer polysilicon layers that are oxidized.

In another embodiment of the present invention, the damascene gate structure includes polysilicon spacers formed on said gate polysilicon layer and said metal layer is encapsulated therein. Optional oxide spacers formed on the barrier layer are also contemplated herein.

In yet another embodiment of the present invention, the gate structure is formed inside a trench that abuts a vertical transistor region and the metal layer forms a butted contact to the vertical transistor gate polysilicon.

DETAILED DESCRIPTION OF THE INVENTION

Figure 1:
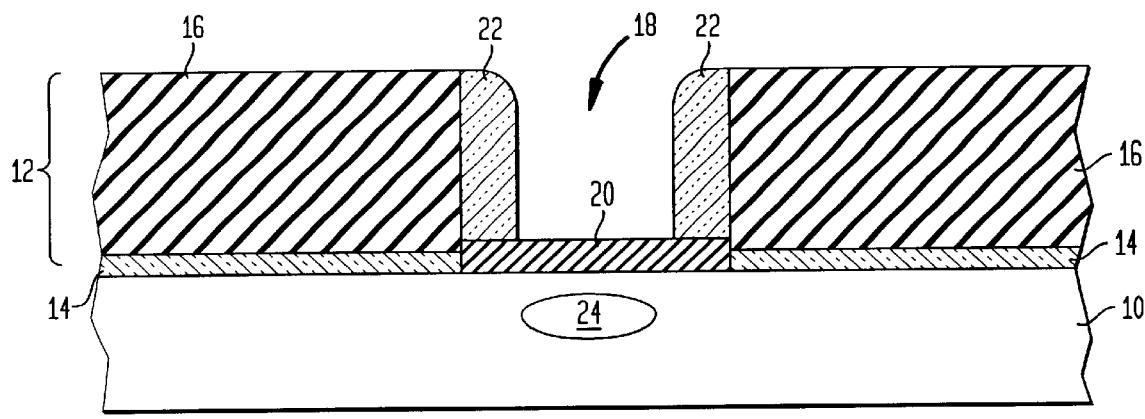
FIGS. 1–4 are cross-sectional views depicting the formation of the damascene gate structure of the present invention through various processing steps.

The present invention which is directed to a damascene gate structure containing an encapsulated metal gate conductor and processes of preparing the same will now be described in more detail by referring to the drawings that accompany the present application. It is noted that in the accompanying drawings like reference numerals are used for describing like and/or corresponding elements.

Reference is first made to FIGS. 1–4 which depict one embodiment of the present invention. In the embodiment shown in FIGS. 1–4, a recessed gate polysilicon layer is employed in fabricating the fully encapsulated metal-containing damascene gate structure. Specifically, FIG. 1 shows an initial structure that is employed in the present invention in fabricating the fully encapsulated gate structure. The structure shown in FIG. 1 comprises a substrate 10 having a gate stack 12 formed thereon. Gate stack 12 includes at least a pad oxide 14 and a pad nitride layer 16 formed on a surface of the substrate. A gate hole 18 having a sacrificial oxide layer 20 and sacrificial spacers 22 are shown in the gate hole. FIG. 1 also shows a $V_T$ implant region 24 in the substrate.

The structure shown in FIG. 1 is composed of conventional materials that are well known to those skilled in the art and conventional processing steps that are also well known in the art are employed in fabricating the same. For example, substrate 10 may comprise any semiconducting material including, but not limited to: Si, Ge, SiGe, GaAs, InAs, InP and all other III/V semiconductor compounds. Layered substrates comprising the same or different semiconductor material, e.g., Si/SiGe, and silicon-on-insulators (SOIs) are also contemplated herein. The substrate may be of the n or p-type depending on the desired device to be fabricated. The substrate may contain active device regions, wiring regions, isolation regions or other like regions. For clarity, these regions are not shown in the drawings, but are nevertheless intended to be included within region 10.

Figure 10:
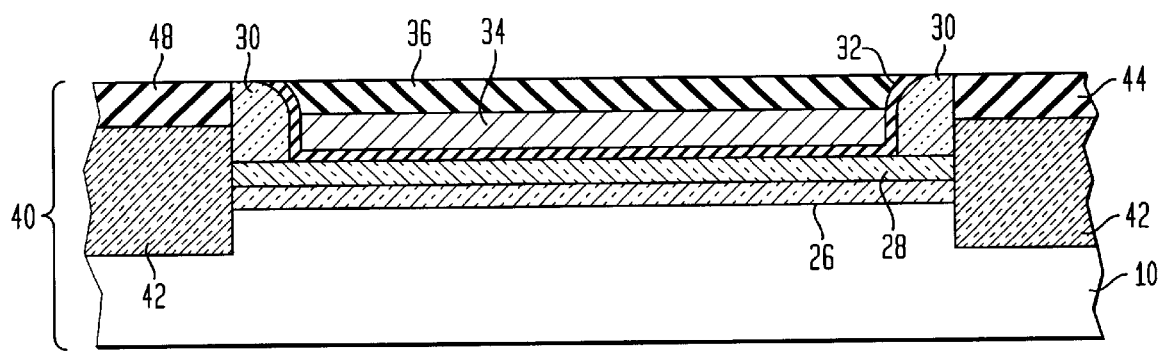

Substrate 10 may also be composed of a dielectric material such as $SiO_2$ and may be used as an isolation region of a memory device. Dielectric substrates are typically used in the present invention when a trench buried vertical device such as shown in FIG. 10 is being formed and they are typically formed on one of the above mentioned semiconductor materials.

A pad oxide layer 14 such as $SiO_2$ is formed on the surface of substrate 10 using a conventional thermal growing process, or alternatively, the pad oxide layer may be formed by a conventional deposition process such as chemical vapor deposition (CVD), plasma-assisted CVD, sputtering, evaporation and other like deposition processes. The thickness of the pad oxide layer may vary and is not critical to the present invention.

Next, a pad nitride layer 16 such as $Si_3N_4$ is formed on the surface of the pad oxide layer utilizing conventional deposition processes well known to those skilled in the art, including one of the deposition processes mentioned above. The thickness of the pad nitride layer may vary and is also not critical to the present invention.

An opening used in forming gate hole 18 is formed in the pad nitride layer stopping on the pad oxide layer. The opening for defining the gate hole is formed by utilizing conventional lithography and etching (reactive-ion etching (RIE), plasma-etching, ion-beam etching and other like dry etching processes may be used). Next, the gate hole is completely formed in the opening provided above by removing a portion of the exposed pad oxide layer. Specifically, the pad oxide layer is removed by a conventional stripping process in which a chemical etchant having a high selectivity for oxide is employed. A conventional photoresist is employed in defining the gate hole and is removed after fabricating the same utilizing a conventional photoresist stripping process. It should be noted that although the drawings of the present invention show only one gate hole in the structure, a plurality of gate holes are also contemplated herein.

The gate hole formed in the present invention is typically, but not necessarily, a high aspect ratio hole. The term "high aspect ratio gate hole" is used herein to denote a gate hole whose height to width ratio (H/W) is about 2 or greater.

Following gate hole formation, a thin sacrificial oxide layer 20 having a thickness of from about 2 to about 10 nm is formed in the bottom portion of the gate hole on an exposed portion of the substrate. The sacrificial oxide layer can be formed utilizing a thermal growing process, or alternatively, one of the above-mentioned deposition processes can be employed.

At this time of the process, well implants (not shown in the drawings) may be formed in the substrate utilizing conventional ion implantation and activation annealing. The well implants may also be formed prior to forming the gate stack on the substrate.

Next, sacrificial spacers 22 composed of doped glass such as boron silicate glass (BSG), phosphorus silicate glass (PSG), arsenic silicate glass (ASG) and boron-phosphorus silicate glass (BPSG) are formed utilizing a conventional deposition process such as CVD and then the deposited silicate material is etched by RIE or another like etch process to form the spacers. The thickness of the sacrificial spacers may vary, and is not relevant to this invention. They exist only to keep the $V_t$ implants away from the gate edges.

A voltage control, $V_T$, or so-called punch-through implant region 24 is then formed in the surface of substrate 10 utilizing a conventional ion implantation step and activation anneal; both of these processes are well known in the art; therefore, a detailed description of the processes is not needed herein.

Figure 2:
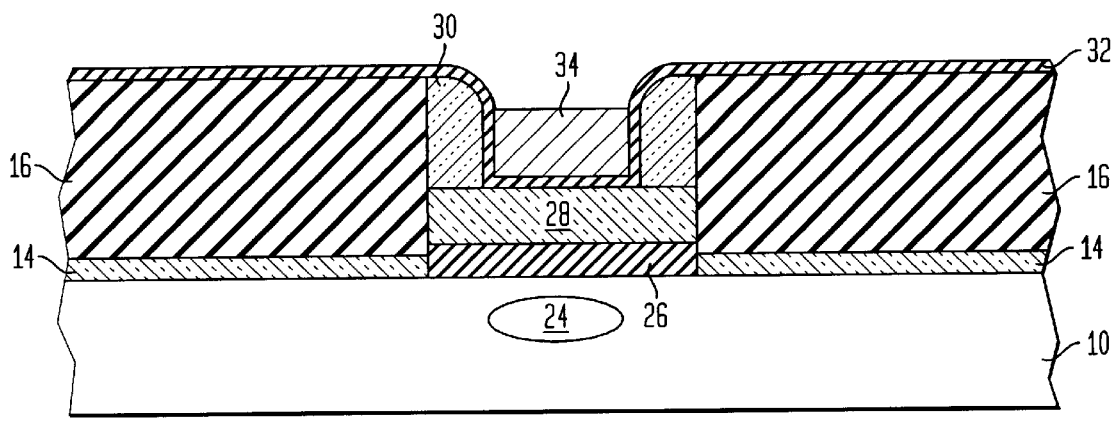

Next, as shown in FIG. 2, the sacrificial spacers and the sacrificial oxide layer are removed from the gate hole so as to expose a portion of the substrate utilizing conventional stripping processes well known in the art. For example, a chemical etchant that is highly selective in removing doped glass as compared to oxide and nitride is used in removing the spacers, and thereafter, a chemical etchant that is highly selective in removing oxide as compared to nitride or Si is used in removing the sacrificial oxide layer. It is also within the contemplation of the present invention to employ an etchant that is capable of removing both the sacrificial spacers and the sacrificial oxide layer at the same time.

A gate oxide layer 26 is formed on the exposed portion of the substrate in the gate hole by utilizing a conventional deposition process or a thermal growing process. The thickness of the gate oxide may vary, but typically the gate oxide has a thickness of from 1.5 to about 15 nm.

The next step of the first embodiment of the present invention involves the formation of a recessed gate polysilicon layer 28 in the gate hole. Specifically, the recessed gate polysilicon layer is formed in the gate hole by first depositing a polysilicon layer on the exposed surfaces of the structure and thereafter a conventional recessing process is employed in removing the deposited polysilicon layer below the uppermost surface of the pad nitride layer. The recessing process employed in the present invention may comprise the use of a dry or chemical wet etch process which is highly selective in removing polysilicon as compared to nitride. Dual workfunction implants are performed (or a single workfunction polysilicon is deposited). The recessed gate polysilicon may be doped with plasma or vapor phase or solid state doping techniques as well as conventional implantation.

Next, polysilicon spacers 30 are formed in the gate hole on top of the recessed gate polysilicon layer utilizing conventional deposition process and etching. The thickness of the polysilicon spacers may vary, but typically the spacers have a thickness of from about 10 to about 30 nm.

Barrier layer 32 is formed on all exposed surfaces of the structure, See FIG. 2, utilizing a conventional deposition process such as CVD, plasma-CVD, sputtering, plating and other like deposition techniques. The barrier layer is composed of any material that is capable of preventing dopant penetration into the underlying material layers of the structure. Illustrative examples of such materials include, but are not limited to: WN, TaN, TaSiN and TiN.

After forming the barrier layer, a metal layer is formed on the barrier layer utilizing any conventional deposition process and the metal layer is recessed below the uppermost surface of the pad nitride layer utilizing a conventional recessing process that is highly selective in removing metal as compared to nitride. The above steps form a recessed metal layer 34 in the gate hole.

The metals employed in this step of the present invention include any metal that is highly conductive. For example, the metal may be: W, Pt, Pd, Au, Ir, Ru and other like conductive metals. Of these metals, it is highly preferred to use W herein since W has a low resistivity and can withstand high temperatures. The thickness of the recessed metal layer formed is not critical to the present invention, but typically the recessed metal layer has a thickness of from about 10 to about 100 nm.

Next, a cap oxide layer 36 (See FIG. 3) comprising TEOS is formed on all exposed surfaces of the structure utilizing a conventional deposition process and thereafter the structure is planarized down to the uppermost surface of the pad nitride layer. The planarization step includes the use of a conventional planarization process such as chemical-mechanical polishing (CMP) or grinding.

Alternatively, the barrier layer abutting the gate hole may first be stripped utilizing a conventional stripping process stopping on the pad nitride layer; the cap oxide layer is then deposited; and thereafter the structure is planarized as described above.

Figure 3:
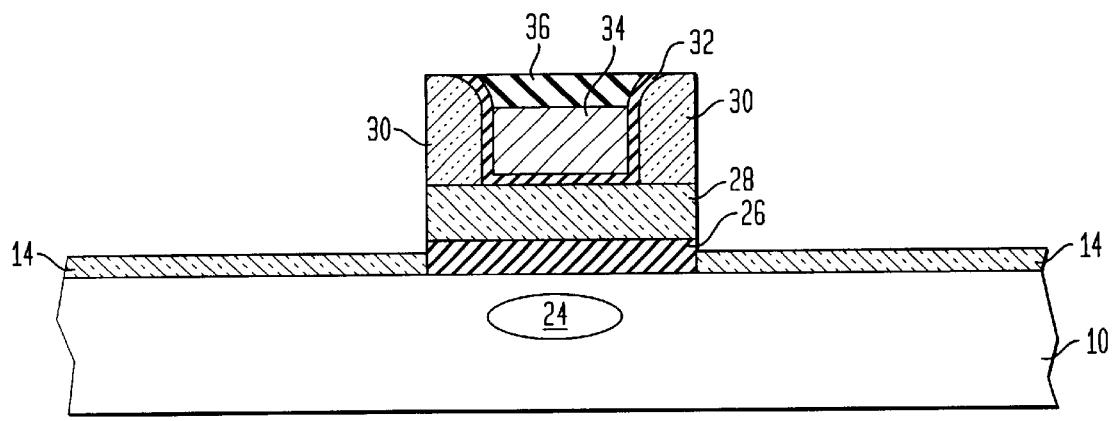

Pad nitride layer 16 is removed utilizing a conventional damascene etch back process to provide the structure shown in FIG. 3. Specifically, FIG. 3 shows a gate structure in which metal layer 34 is completely encapsulated by polysilicon and oxide. It is noted that FIG. 3 illustrates one possible damascene gate structure of the present invention.

Figure 4:
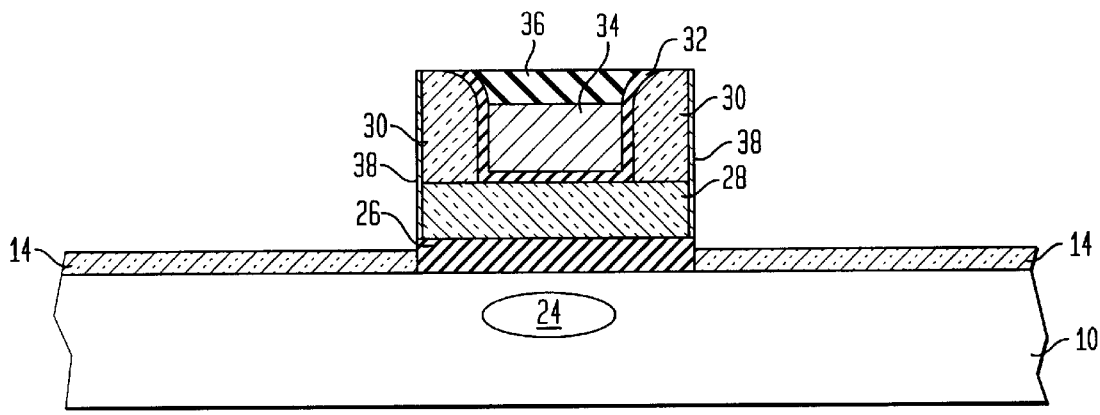

Next, as shown in FIG. 4, the structure of FIG. 3 is subjected to an optional high temperature sidewall oxidation step that is capable of forming an oxidized layer 38 in the exposed sidewalls of the various polysilicon layers of the structure. The optional high temperature oxidation step employed in the present invention is carried out at a temperature of greater than 850° C., preferably greater than 900° C., in an oxidizing ambient such as air, ozone, oxygen, hydrogen or any combinations thereof. A single temperature may be employed, or alternatively, a series of various ramp and soak cycles may also be used. The time in which the optional oxidation step is performed may vary depending on the desired thickness of the oxidized layer, but typically the oxidation permits the formation of oxide regions having a thickness of from about 3 to about 20 nm.

By employing the above defined optional oxidation step, a significant bird's beak forms at the corners of the gate polysilicon layers reducing leakage and improving DRAM transfer characteristics. Moreover, since the above process does not result in polysilicon RIE damage at the edge of the gate conductor, as is the case in prior art processes, significant improvement in leakage characteristics may be achieved.

Figure 5:
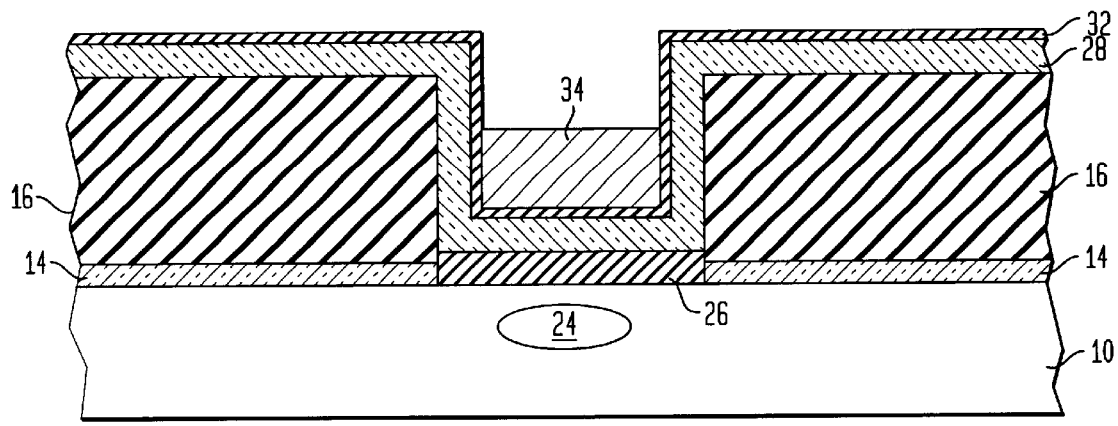
FIGS. 5–6 show an alternative embodiment of the present invention.
Figure 6:
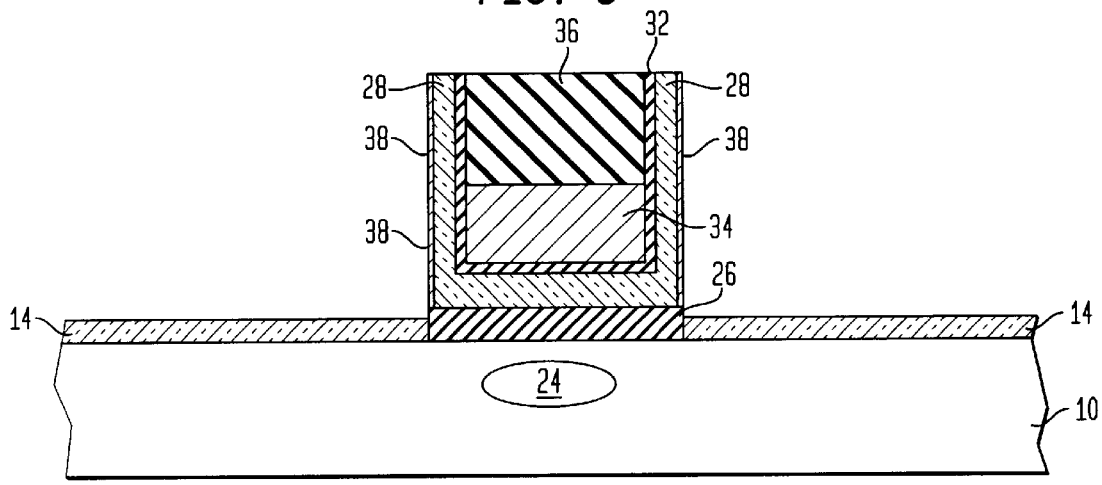

The above description and FIGS. 1–4 are directed to first embodiments of the present invention wherein a recessed gate polysilicon layer is employed. In a second embodiment of the present invention, gate polysilicon layer 28 is not recessed prior to forming the recessed metal layer. In this embodiment, no spacers are needed (See, FIG. 5), or optionally, oxide spacers 33 are utilized (See, FIG. 7). In FIG. 5, the processing steps used in forming the structure shown in FIG. 1 are first performed. Thereafter, gate polysilicon layer 28 is deposited on all exposed surfaces of the structure and dual workfunction implants are performed (or a single workfunction polysilicon is deposited). Note that the polysilicon may be doped with plasma or vapor phase or solid state techniques. A barrier layer 32 and a recessed metal layer 34 as described above are then formed and thereafter cap oxide layer 36 is formed. The polysilicon/oxide stack abutting the gate hole, i.e., layers 28 and 36, as well as the barrier layer are removed by a conventional planarization technique. The structure is then subjected to the above described damascene etch back step and, if desired, the optional oxidation step providing the structure shown in FIG. 6.

Figure 7:
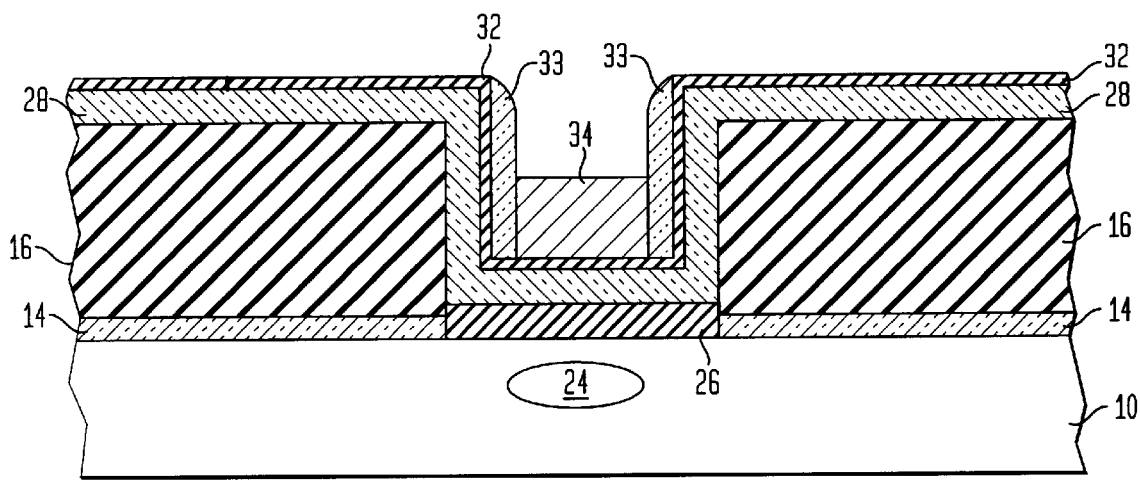
FIGS. 7–8 show another alternative embodiment of the present invention.
Figure 8:
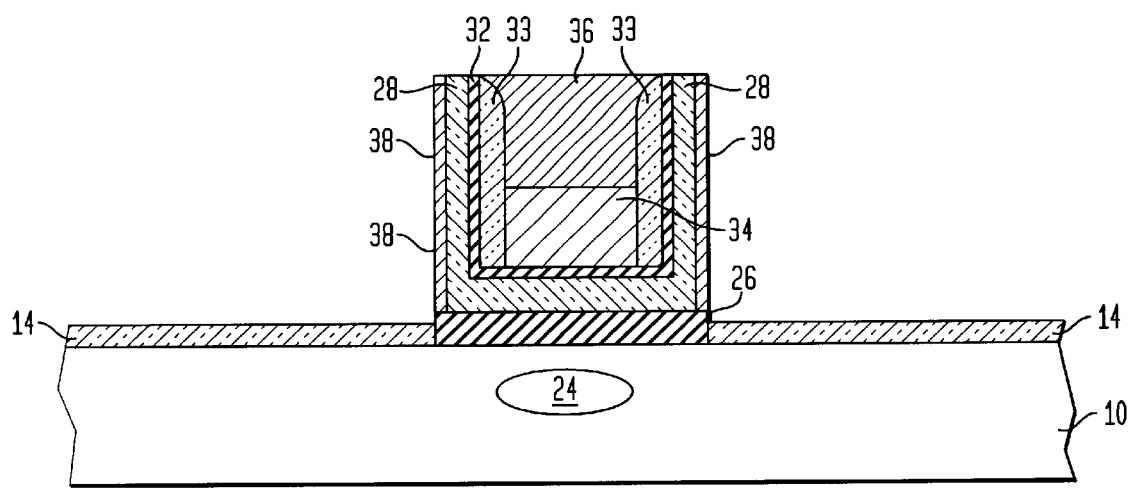

Insofar as FIGS. 7–8 are concerned, the structure in FIGS. 7–8 includes oxide spacers 33 which are formed after depositing gate polysilicon layer 28. Again, the processing steps used in forming the structure in FIG. 1 are first performed and thereafter an undoped gate polysilicon layer 28 is formed. Spacers comprising TEOS are then formed and dual work function implants as defined above are performed either before or after the TEOS spacer formation. A barrier layer is deposited as described above and W or other like metal is deposited and recessed below the pad nitride layer. Cap oxide layer 36 is then formed and the polysilicon/oxide stack is polished to the pad nitride layer by CMP. Next, the nitride pad layer is etched back and, if desired, the optional sidewall oxidation is performed as described above providing the structure shown in FIG. 8.

Additional post gate stack processing steps well known to those skilled in the art may then be performed either following the etch back step or the optional oxidation step.

In an additional embodiment of the present invention, the encapsulated metal is used as a worldline lining layer for vertical DRAMs. In the case of a vertical gate trench stacked DRAM, the encapsulated metal is used to contact the vertical gate trench polysilicon.

Figure 9:
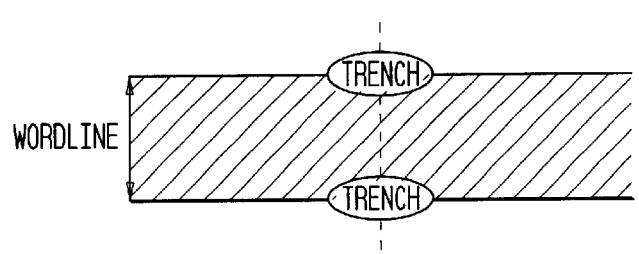
FIGS. 9–10 are top and cross-sectional views, respectively, depicting the damascene gate structure of the present invention in a vertical transistor device.

FIG. 9 is a top view which illustrates the intersection of a buried wordline (with encapsulated metal such as W) with a trench (in the case of a vertical trench DRAM). A buried bitline (in the case of a vertical stacked DRAM) structure would be similar.

FIG. 10 shows a cross-sectional view of a typical trench buried wordline vertical device in which the processes of the present invention can be employed. In FIG. 10, the inventive damascene gate is located in a trench that is formed in the surface of substrate 10 adjacent to a vertical transfer gate region 40 that comprises a vertical transfer polysilicon region 42 and an oxide cap 44. The substrate in this case may be a semiconductor substrate or it may be an isolation region that is filled with a dielectric.

The trench is formed by depositing additional substrate material adjacent to the gate structure and, if needed, planarizing the structure. A photoresist is then applied and transfer gate region 40 is formed utilizing conventional processes well known in the art. It is noted that in this embodiment of the present invention, there is no need to subject the outer polysilicon layers of the encapsulated metal to the above mentioned optional oxidation step. Instead in this structure, the polysilicon layers are directly in contact with the trench gate polysilicon 42. Moreover, in this embodiment of oxide spacers 33 are not employed. FIG. 9 is a top view of the structure shown in FIG. 10.

While this invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

Having thus described our invention in detail, what we claim as new and desire to secure by the Letters Patent is:

1. A damascene gate structure comprising:
   a substrate having a gate oxide layer present atop a surface portion of said substrate;
   a gate polysilicon layer present on said gate oxide layer, said gate polysilicon layer having a lower horizontal surface and vertical surfaces having an outer portion;
   a vertical feature present on the gate polysilicon layer having an outer portion wherein the outer portions of the gate polysilicon layer and vertical feature are oxidized to form an oxide layer, wherein a bottom portion of the oxide layer is present on the gate oxide layer;
   a metal layer present on said lower horizontal surface of said polysilicon layer; and
   an oxide cap layer present atop said metal layer, wherein said gate polysilicon layer, said gate oxide, said vertical feature and said oxide cap layer completely encapsulate said metal layer.

2. The damascene gate structure of claim 1 wherein said substrate is a semiconducting material selected from the group consisting of Si, Ge, SiGe, GaAs, InAs, InP, and layered semiconductor substrates.

3. The damascene gate structure of claim 1 wherein said metal is W, said oxide cap layer is comprised of TEOS CVD.

4. The damascene gate structure of claim 1 wherein the vertical feature comprises the gate polysilicon layer.

5. The damascene gate structure of claim 1 wherein the oxide layer has a thickness of 3 to 20 nm.

6. A damascene gate structure comprising:
   a substrate having a gate oxide layer present atop a surface portion of said substrate;
   a gate polysilicon layer present on said gate oxide layer, said gate polysilicon layer having a lower horizontal surface and vertical surfaces having an outer portion;
   a vertical feature present on the gate polysilicon layer having an outer portion wherein the outer portions of the gate polysilicon layer and vertical feature are oxidized to form an oxide layer, wherein a bottom portion of the oxide layer is present on the gate oxide layer;
   a metal layer present on said lower horizontal surface of said polysilicon layer; and
   an oxide cap layer present atop said metal layer, wherein said gate polysilicon layer, said gate oxide, said vertical feature and said oxide cap layer completely encapsulate said metal layer;
   wherein said vertical feature comprises polysilicon spacers present on said gate polysilicon layer.

7. A damascene gate structure comprising;
   a substrate having a gate oxide layer present atop a surface portion of said substrate;
   a gate polysilicon layer present on said gate oxide layer, said gate polysilicon layer having a lower horizontal surface and vertical surfaces having an outer portion;
   a vertical feature present on the gate polysilicon layer having an outer portion wherein the outer portions of the gate polysilicon layer and vertical feature are oxidized to form an oxide layer, wherein a bottom portion of the oxide layer is present on the gate oxide layer;
   a metal layer present on said lower horizontal surface of said polysilicon layer;
   an oxide cap layer present atop said metal layer, wherein said gate polysilicon layer, said gate oxide, said vertical feature and said oxide cap layer completely encapsulate said metal layer; and
   further comprising a barrier layer located between said gate polysilicon layer and said metal layer.

8. The damascene gate structure of claim 7 wherein oxide spacers are present on said barrier layer.

* * * * *